(12) United States Patent
Leussler et al.

(10) Patent No.: US 11,402,450 B2
(45) Date of Patent: Aug. 2, 2022

(54) RF COIL DEVICE AND RF SHIELD DEVICE FOR DIFFERENT MRI MODES

(71) Applicant: KONINKLIJKE PHILIPS N.V., Eindhoven (NL)

(72) Inventors: Christoph Leussler, Hamburg (DE); Christian Findeklee, Norderstedt (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 84 days.

(21) Appl. No.: 16/468,759

(22) PCT Filed: Dec. 21, 2017

(86) PCT No.: PCT/EP2017/083987
§ 371 (c)(1),
(2) Date: Jun. 12, 2019

(87) PCT Pub. No.: WO2018/115223
PCT Pub. Date: Jun. 28, 2018

(65) Prior Publication Data
US 2019/0317164 A1    Oct. 17, 2019

(30) Foreign Application Priority Data
Dec. 22, 2016 (EP) .................... 16206076

(51) Int. Cl.
*G01R 33/422* (2006.01)
*G01R 33/34* (2006.01)
(Continued)

(52) U.S. Cl.
CPC ..... *G01R 33/422* (2013.01); *G01R 33/34007* (2013.01); *G01R 33/3453* (2013.01); *G01R 33/34076* (2013.01); *H01F 5/003* (2013.01)

(58) Field of Classification Search
CPC ............ G01R 33/422; G01R 33/34007; G01R 33/34076; G01R 33/3453; H01F 5/003
See application file for complete search history.

(56) References Cited

U.S. PATENT DOCUMENTS

| 4,638,253 A | 1/1987 | Jaskolski et al. |
| 4,642,569 A | 2/1987 | Hayes et al. |
| (Continued) | | |

OTHER PUBLICATIONS

NPL: http://mriquestions.com/birdcage-coil.html (Year: 2016).*
(Continued)

*Primary Examiner* — Akm Zakaria

(57) ABSTRACT

The present invention provides a radio frequency (RF) shield device (124) for a magnetic resonance (MR) examination system (110), whereby the RF shield device (124) comprises a first shield (250) and a second shield (252), the first shield (250) and the second shield (252) are arranged with a common center axis (118), the first shield (250) has a shield structure (254) different from a shield structure (254) of the second shield (252), and the first shield (250) and the second shield (252) are designed in accordance with different modes of operation of a RF coil device (140). The present invention also provides a radio frequency (RF) coil device (140) for a magnetic resonance (MR) examination system (110), whereby the RF coil device (140) comprises a first coil (200) and in a second coil (202), the first coil (200) and the second coil (202) are provided as birdcage coils, the first coil (200) and the second coil (202) are arranged with a common center axis (118), the first coil (200) and the second coil (202) have rungs (204), which are arranged non-parallel to the center axis (118) of the RF coil device (140), the first coil (200) has a coil structure (210) different from a coil structure (210) of the second coil (202), and the first coil (200) and the second coil (202) are switchable to be active for different modes of operation. The (Continued)

present invention further provides a magnetic resonance (MR) imaging system (110), comprising such a RF coil device (140) and/or such a RF shield device (124).

13 Claims, 9 Drawing Sheets

(51) Int. Cl.
*G01R 33/345* (2006.01)
*H01F 5/00* (2006.01)

(56) References Cited

U.S. PATENT DOCUMENTS

| | | | | |
|---|---|---|---|---|
| 5,243,286 | A * | 9/1993 | Rzedzian | G01R 33/3854 324/318 |
| 5,680,046 | A | 10/1997 | Frederick et al. | |
| 6,100,691 | A | 8/2000 | Yeung | |
| 6,420,871 | B1 * | 7/2002 | Wong | G01R 33/34046 324/318 |
| 6,791,328 | B1 * | 9/2004 | Nabetani | G01R 33/34076 324/318 |
| 7,145,339 | B2 | 12/2006 | Kramer et al. | |
| 7,498,809 | B2 | 3/2009 | Takahashi et al. | |
| 7,501,828 | B1 * | 3/2009 | Wong | G01R 33/34046 324/318 |
| 8,659,296 | B2 | 2/2014 | Leussler | |
| 2001/0035504 | A1 | 11/2001 | Hayes | |
| 2003/0020476 | A1 * | 1/2003 | Duensing | G01R 33/34046 324/318 |
| 2003/0071622 | A1 | 4/2003 | Reisker et al. | |
| 2007/0079253 | A1 | 4/2007 | Leussler | |
| 2009/0243511 | A1 | 10/2009 | Wang | |
| 2009/0243611 | A1 | 10/2009 | Holle et al. | |
| 2009/0302841 | A1 | 12/2009 | Avdievich et al. | |
| 2010/0033185 | A1 * | 2/2010 | Saha | G01R 33/34076 324/318 |
| 2013/0082709 | A1 * | 4/2013 | Rath | G01R 33/34076 324/310 |
| 2014/0253126 | A1 * | 9/2014 | Habara | G01R 33/3453 324/322 |
| 2015/0130466 | A1 | 5/2015 | Lips et al. | |
| 2018/0321339 | A1 * | 11/2018 | Yang | G01R 33/3415 |

OTHER PUBLICATIONS

King et al. "Phase Encoding Without Gradients Using Trase-FSE MRI" International Soc. for Magnetic Reson. in Med. vol. 15 Dec. 31, 2007, p. 680.

D.C. Alsop, T.J. Connick, G. Mizsei "A spiral volume coil for improved RF field homogeneity at high static magnetic field strength" MRM 40:1, 49-54 (1998).

A. Reycowski "V-Cage and V-Array: Novel Coil Structures for Higher Field Strenghts" Proc. Intl. Soc. Mag. Reson. Med. 13 (2005) p. 950.

International Search Report in PCT/EP2017/083987 dated May 23, 2018.

* cited by examiner

RF COIL DEVICE AND RF SHIELD DEVICE FOR DIFFERENT MRI MODES

CROSS REFERENCE TO RELATED APPLICATIONS

This application is a U.S. national phase application of International Application No. PCT/EP2017/083987 filed on Dec. 21, 2017, which claims the benefit of EP Application Serial No. 16206076.8 filed on Dec. 22, 2016 and is incorporated herein by reference.

FIELD OF THE INVENTION

The invention relates to the field of magnetic resonance (MR) imaging systems, in particular to the field of RF coils and RF shields for MR imaging systems. The invention relates in particular to a design of RF coil devices with a birdcage structure or with a transverse electromagnetic (TEM) coil structure. The invention in particular also relates to a design of RF shields, in particular for use with the RF coil devices.

BACKGROUND OF THE INVENTION

In high field magnetic resonance imaging (MRI), image quality often suffers from poor B1 field homogeneity caused by wave propagation effects of the RF field. Thus field inhomogeneity continues to be a major challenge in today's high-field magnetic resonance (MR) examination systems, in particular for latest MR examination systems with strong magnetic fields of 3T or 7T. Among various RF coils designed to address this problem, birdcage coils with rungs extending in directions not linear compared to a longitudinal direction of the RF coils have been introduced to improve field homogeneity for MRI imaging.

However, the proposed coil design breaks with a standard birdcage coil design, where rungs of the coil extend in the longitudinal direction of the RF coils. Hence, RF coil symmetry compared to a standard birdcage coil is broken. There are typically two orientations for a non-linear extensions of the rung conductors of the RF coil. Both directions can be either individually optimal e.g. for transmission or reception mode. However, when deviating from the standard birdcage, no coil arrangement is optimal for both reception and transmission mode.

The above principles also apply in case of other RF coil types than birdcage coils, in particular in case of a transverse electromagnetic (TEM) coil.

SUMMARY OF THE INVENTION

It is an object of the invention to provide radio frequency (RF) coil device for a magnetic resonance (MR) examination system, a radio frequency (RF) shield device for a magnetic resonance (MR) examination system, and a magnetic resonance (MR) examination system comprising at least one of the radio frequency (RF) coil device and the radio frequency (RF) shield device, which enable improved MR imaging. In particular, it is an object of the present invention to improve homogeneity of the MR fields in the RF coil and—more general—an examination space of the MR imaging system, further preferred it is an object of the present invention to improve homogeneity of the B1 field.

This object is achieved by a radio frequency (RF) shield device for a magnetic resonance (MR) examination system, whereby the RF shield device comprises a first shield and a second shield, the first shield and the second shield are arranged with a common center axis, the first shield has a shield structure different from a shield structure of the second shield, and the first shield and the second shield are designed in accordance with different modes of operation of a RF coil device. That is, these shields are arranged in terms of their electrical and geometrical arrangement of the electrical conductor patterns to support the substantive technical effect of shielding in respective modes or even to optimize the shielding separately for the different modes.

RF shielding in different modes entails the technical effect of shielding from different types of radiofrequency fields. RF shielding in the RF transmit (TX) mode entails shielding from high power RF fields, such as for excitation (transversely over a spin flip angle), refocusing or inversion of nuclear spins. Further, different modes may involve different radiofrequency bands for application to magnetic resonance of different species of atomic nuclei having different value of the gyromagnetic ratio. Also, different RR excitation modes may relate to RF excitation of different resonant modes of the RF coil device. The different RF transmit modes are associated with the activation of different RF antenna elements using individual radiofrequency electrical current patterns generating different spatial distributions of the RF transmit fields. For example the respective first, seconds and further shields can be optimised for RF shielding of the individual linear modes of a quadrature RF body coil. Each of the linear modes associates with a different RF field distribution that needs individual technical arrangements to bring about the cancellation of RF fields in volumes (e.g. peripherally to the RF coil) where shielding is required.

This object is also achieved by a radio frequency (RF) coil device for a magnetic resonance (MR) examination system, whereby the RF coil device comprises a first coil and a second coil, the first coil and the second coil are provided as birdcage coils, the first coil and the second coil are arranged with a common center axis, the first coil and the second coil have rungs, which are arranged non-parallel to the center axis of the RF coil device, the first coil has a coil structure different from a coil structure of the second coil, and the first coil and the second coil are switchable to be active for different modes of operation.

Furthermore, this object is achieved by a radio frequency (RF) coil device for a magnetic resonance (MR) examination system, whereby the RF coil device comprises a first coil and a second coil, the first coil and the second coil are arranged with a common center axis, the first coil and the second coil have rungs, which are arranged non-parallel to the center axis of the RF coil device, the RF coil device is provided integrally with a RF screen device surrounding the first coil and the second coil, the rungs are coupled to the RF screen device, the first coil has a coil structure different from a coil structure of the second coil, and the first coil and the second coil are switchable to be active for different modes of operation. These different modes of operation entail different radiofrequency fields. The RF-transmit and receive fields are different in that the RF-transmit field are high power RF-fields for e.g. excitation, refocusing or inversion of nuclear spins. The RF-fields in the receive modes are associated with the magnetic resonance signals are very low power magnetic resonance signals. Furthermore, different modes (TX as well as RX) may be associated with different RF frequency bands, e.g. relating to manipulation of or signal acquisition from different types of atomic nuclei. The invention for example achieves to separately optimize spatial the homogeneity of the (i)clockwise circularly polarised dynamic magnetic field (B1+) excitation modes as well as (ii) the counter-clockwise dynamic magnetic field (B1−). That is, the invention enables individual optimization of both the RF excitation field as well as the homogeneous receive sensitivity for the magnetic resonance signals. That is, these (bird cage) RF coils are arranged in terms of their electrical and geometrical arrangement of the electrical conductor patterns to support the substantive technical effect of field transmission or receive sensitivity in respective modes or even to optimize the shielding separately for the different modes.

This object is further achieved by a radio frequency (RF) arrangement comprising a radio frequency (RF) coil device as specified above and a RF shield device as specified above.

This object is further achieved by a magnetic resonance (MR) imaging system, comprising a tubular examination space provided to position a subject of interest therein, an RF shield device for shielding the examination space, a magnetic gradient coil system for generating gradient magnetic fields superimposed to the static magnetic field, and a main magnet for generating a static magnetic field, whereby the RF shield device, the magnetic gradient coil system and the main magnet are positioned concentrically in this order in a direction radially outward around the examination space, wherein the magnetic resonance (MR) imaging system comprises at least one radio frequency (RF) coil device as specified above, which is arranged concentrically within the RF shield device, and the magnetic resonance (MR) imaging system further comprises a switching device for switching the RF coil device between at least two different modes of operation.

This object is still further achieved by a magnetic resonance (MR) imaging system, comprising a tubular examination space provided to position a subject of interest therein, a magnetic gradient coil system for generating gradient magnetic fields superimposed to the static magnetic field, and a main magnet for generating a static magnetic field, whereby the magnetic gradient coil system and the main magnet are positioned concentrically in this order in a direction radially outward around the examination space, wherein the magnetic resonance (MR) imaging system comprises at least one radio frequency (RF) coil device as specified, which is arranged concentrically within magnetic gradient coil system, and the magnetic resonance (MR) imaging system further comprises a switching device for switching the RF coil device between at least two different modes of operation.

Hence, with the first and the second coil of the RF coil device, two coil structures can be combined in a single RF coil device. In the MR imaging system, it can be easily switched between the different modes and the respective coils using a switching device, which connects the first and second coil as required to a signal path of the MR imaging system. Hence, TX and/or RX signals can be connected to the first and second coil individually as required. An optimum choice of coils structures can be performed for each mode, so that MR image quality can be further improved. The first and second coil enable improved shimming for homogeneous B1 fields. Based on the first and second coil, an appropriate coil structure of the RF col device can be applied to a subject of interest. Furthermore, a good control of local and global SAR can be achieved.

The first coil and the second coil are provided as birdcage coils or as transverse electromagnetic (TEM) coils. In particular, the RF coil device can be provided with a birdcage structure, which are provided with conductive end rings, and where the rungs of each of the first and second coil are connected to the conductive end rings. Alternatively, the RF coil device can be provided with a TEM structure, which does not have conductive end rings. Hence, the rungs of the first and second RF coils having a TEM structure are coupled to the RF screen as ground connection. Hence, the TEM coil requires the RF shield device for coupling the rungs thereto, so that the RF shield device provides a ground connection. In case of the birdcage coil, the RF shield device merely serves for shielding RF fields generated in the MR imaging system.

A single RF coil for simultaneous optimization for different modes, e.g. transmit and receive mode, has turned out essentially impossible for RF coils with rungs, which are arranged non-parallel to a center axis of the RF coil. Hence, with the RF coil device of the present invention, each coil of the RF coil device can have an optimized coil structure in respect to one of the modes. Accordingly, a great parameter space for improved B1 field homogenization can be achieved. Furthermore, reduced power absorption in the subject of interest and improved SNR can be achieved.

Still further, with the first and the second shield of the RF shield device, two individual shield structures can be combined in a single RF shield device. When the MR imaging system switches between different modes, the RF shield device can adequately shield the resulting RF fields with the two individual shields, one of which is optimized for one mode of operation of the RF coil device. Hence, an improved RF shielding is achieved, which is independent from a mode of operation of the RF coil device. The first and second RF screen can further comprise lumped capacitors connected to the respective shield structure. The capacitors can be soldered to the shield structure of the first and second shield to bridge slits provided in the first and second shield for RF currents. The slits are provided in the shield structures to avoid low frequency eddy currents. The RF coil device can of course comprise more than two coils, e.g. a third and even further coils. The additional coils can be optimized for further modes or they can be provided to generate together with at least one other coil an improved RF field for one mode of the RF coil device.

Similarly, also the RF shield device can comprise more than two shields, e.g. a third and even further shields. The additional shields can be optimized for further modes or provide together with at least one other shield provide an improved shielding for one mode of the RF coil device.

The first and second coil of the RF coil device can be provided as independent coils, which are together mounted in the MR imaging device. Preferably, the first and second coil of the RF coil device are attached to each other, so that they can be easily mounted in the MR imaging system. Further preferred, the first and second coil are attached to a common mounting structure.

Similar to the coils of the RF coil device, also the first and second shield of the RF shield device can be provided as independent shields, which are together mounted in the MR imaging device. Preferably, the first and second shield of the RF shield device are attached to each other, so that they can be easily mounted in the MR imaging system. Further preferred, the first and second shield are attached to a common mounting structure.

In a preferred embodiment, the RF shield device and the RF coil device are attached to each other and can be provided as a single component, e.g. a RF arrangement.

In general, principles discussed with respect to the different RF coil devices are also applicable to the RF shield device, and vice-versa. Furthermore, principles discussed with respect to RF coil devices having a birdcage structure are, in general, also applicable to RF coil devices with a TEM-structure.

According to a preferred embodiment, the first and the second coil are arranged to share at least one conductive end ring. Accordingly, coupling capacitors provided in the end rings have to be provided only once for a shared ring, which facilitates the design of the RF coil device. The first and the second coil can be arranged to share both end rings. This enables a high reduction of a number of used capacitors. However, already when the first and the second coil are arranged to share one end ring, the number of capacitors can be reduced. Alternatively, each of the first and the second coil has individual end rings, which enables full control of all electric characteristics of the coils.

According to a preferred embodiment of the TEM coil device, the RF screen device of the radio frequency (RF) coil device is a RF screen device as specified above, and the rungs of the first and the second coil are coupled to the first and second shield, respectively. Hence, in case of the RF coil device provided with a TEM-structure, the rungs can be coupled to the first and second shield of the RF shield device to improve the shielding for each mode of operation. However, the each of the first and second RF shield can be provided as inner shield or outer shield, as far as applicable.

According to a preferred embodiment, the RF coil device comprises a cylindrical coil PCB, and the rungs of the first coil and the second coil are provided as metallization layers at an inner side and an outer side of the coil PCB. The term PCB refers to a printed circuit board. With the described setup, the RF coil device can be provide as a highly integrated device with compact dimensions. Furthermore, the first and second coils are easy to manufacture as metallization layers on the PCB. The term "metallization layer" refers to a metallic coil structure deposited on the coil PCB, which can have essentially any structure. Hence, it is not required that the metallization layer entirely covers one side of the coil PCB. The coil PCB provides structural integrity for both the first and the second coil. In particular, the first and second coil can be provided with a small thickness on the coil PCB. The coil PCB can in principle be any kind of PCB with typical dielectric characteristics. A preferred dielectric material for the coil PCB is e.g. known as FR-4. In general, the coil PCB can also be a multilayer PCB, where multiple metallization layers can be provided, e.g. when the RF coil device comprises multiple coils.

According to a preferred embodiment, the first coil and the second coil comprise coil elements of the metallization layers on the inner side and the outer side of the coil PCB, or vice-versa. Hence, coil structures of one coil are provided at one side of the coil PCB, and coil structures of the other coil are provided on the other side of the coil PCB.

According to a preferred embodiment, the first coil and the second coil are formed comprising coil elements of the metallization layers on both the inner side and the outer side of the coil PCB. Hence, the coil elements of the first and second coil can be provided at both sides of the coil PCB. The respective coil elements at the inner side and the outer side of the coil PCB are coupled to each other to form the coil structures of the first and second coil. This design of the RF coil device enables providing the RF coil device with a reduced quantity of metal for metallizations, since coil elements at the inner and the outer face of the coil PCB can be efficiently used for the first or the second coil. Furthermore, transmitter and receiver can independently switch between the individual coil current patterns. Different distances of metallization layers from the center axis of the RF coil device can be compensated using such an interleaved/stacked coil design, whereby coil elements of the metallization layers at the inner side and the outer side of the coil PCB together form the respective first and second coil. In case of a multilayer PCB, a coil can be formed comprising coil elements of at least two metallization layers. In principle, a coil can also be formed comprising coil elements of more than two metallization layers.

According to a preferred embodiment, the first coil and the second coil have a coil structure with sinusoidal shape, a parabolic shape, a V-shape, a spiral shape, or a sinc-shape of rungs, or any combination thereof. These shapes enable efficient field generation also for high field strength of nowadays MR imaging systems with magnetic fields of 3T or 7T, and at the same time improve homogeneity of the B1 field.

According to a preferred embodiment, the first coil and has a coil structure, which is mirrored compared to a coil structure of the second coil. In some cases, depending on a shape of the coil structure, symmetry of the first and second coil cannot be achieved. Hence, mirroring has proven suitable to provide the individual coils. Mirroring can be performed in respect to a cylindrical surface, e.g. at a center axis of the cylindrical surface in an axial direction of the RF coil device, or in respect to an axis perpendicular to this axis.

According to a preferred embodiment, the different modes of operation comprise a TX mode and a RX mode of the RF coil device.

Preferably, the first coil and the second coil have a parabolic shape, and the coil out of the first coil and the second coil active for TX mode is provided with an extension of 70 degrees, and the coil active for RX mode is provided with an extension of 150 degrees. This coil structure has proven efficient for e.g. a 2 channel RF coil device to provide a homogeneous B1 field.

Preferably, the coil out of the first coil and the second coil active for TX mode is provided as a multi frequency tuned coil, and the coil out of the first coil and the second coil active for RX mode is provided as a single frequency tuned coil. With the first and second coil being provided as two individual coils, tuning can be improved to be most suitable for each mode. However, complexity of the RX coil can be reduced, since double tuning, or even more complex tuning, is limited to coil, where improvements in MR scan quality can be achieved. E.g. the coil active for TX mode can be a double tuned coil, tuned at fluorine F19 and H1 proton, by way of example. The coil active for RX mode can be a single tuned coil, which is tuned for H1 proton only.

Preferably, the first coil and the second coil are provided as multi frequency tuned coils, wherein at least one of the first coil and the second coil is tuned for a frequency the other coil is not tuned for. Essentially, any combination of tuning frequencies can be chosen.

According to a preferred embodiment, the coil out of the first coil and the second coil active for TX mode is provided with a coil structure for high power transmission, and the coil active for RX mode is provided with a low power design. Hence, the coil active in TX mode can be provided e.g. with a relatively thick metallization permitting high maximum currents, whereas the coil active in RX mode can be provided e.g. with a relatively thin metallization, which only permits a reduced maximum current. Furthermore, also capacitors of the coil active for TX mode can be provided e.g. with high voltage capacitors, which is typically not required for the coil active for RX mode.

According to a preferred embodiment, the first and the second coil comprise each at least one tuning device, whereby the tuning devices of the first and the second coil are located at different cylindrical positions in respect to the RF coil device. Not only different tuning frequencies can be achieved, also hardware for tuning the first and second RF coil can be different. E.g. for radio therapy, electronic components need to be located outside a radiation beam.

According to a preferred embodiment, each shield of the first shield and the second shield is designed in accordance with one mode of operation. Hence, the first and second shield can be adapted to perform an optimized shielding depending on the respective fields generated by the first and second RF coil.

According to a preferred embodiment, the RF shield device comprises a cylindrical shield PCB, and the first shield and the second shield are provided as metallization layers at an inner side and an outer side of the shield PCB. The term PCB refers to a printed circuit board. With the described setup, the RF shield device can be provided as a highly integrated device with compact dimensions. Furthermore, the first and second shields are easy to manufacture as metallization layers on the PCB. The term "metallization layer" refers to a metallic shield structure deposited on the shield PCB. The shield PCB provides structural integrity for both the first and the second shield. In particular, the first and second shield can be provided with a small thickness on the shield PCB. The shield PCB can in principle be any kind of PCB with typical dielectric characteristics. A preferred dielectric material for the shield PCB is e.g. known as FR-4. In general, the shield PCB can also be a multilayer PCB, where multiple metallization layers can be provided, e.g. when the RF shield device comprises multiple shields.

According to a preferred embodiment, the first shield and the second shield are formed comprising shield elements of the metallization layers on the inner side and the outer side of the shield PCB, or vice-versa. In case of a multilayer PCB, a shield can be formed comprising shield elements of at least two metallization layers.

According to a preferred embodiment, the first shield and the second shield are formed corresponding to the first and second coil of the RF coil device.

According to a preferred embodiment, the first shield and the second shield are formed comprising shield elements of the metallization layers on both the inner side and the outer side of the shield PCB. The shield elements of the first and second shield can be provided at both sides of the shield PCB. The respective shield elements at the inner side and the outer side of the shield PCB are coupled to each other to form shield structures of the first and second shield. This design of the RF shield device enables providing the RF shield device with a reduced quantity of metal for metallizations, since shield elements at the inner and the outer face of the shield PCB can be efficiently used for the first or the second shield. In case of a multilayer PCB, a shield can be formed comprising shield elements of at least two metallization layers. In principle, a shield can also be formed comprising shield elements of more than two metallization layers.

According to a preferred embodiment, the first shield and the second shield have a shield structure with sinusoidal slits, parabolic slits, V-slits, a sinc-shape slits, or any combination thereof.

According to a preferred embodiment, the first shield and has a shield structure, which is mirrored compared to a shield structure of the second shield. Mirroring can be performed in respect to a cylindrical surface, e.g. at a center axis of the cylindrical surface in an axial direction of the RF shield device.

According to a preferred embodiment of the magnetic resonance (MR) imaging system, the RF shield device is a radio frequency (RF) coil device as specified above.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
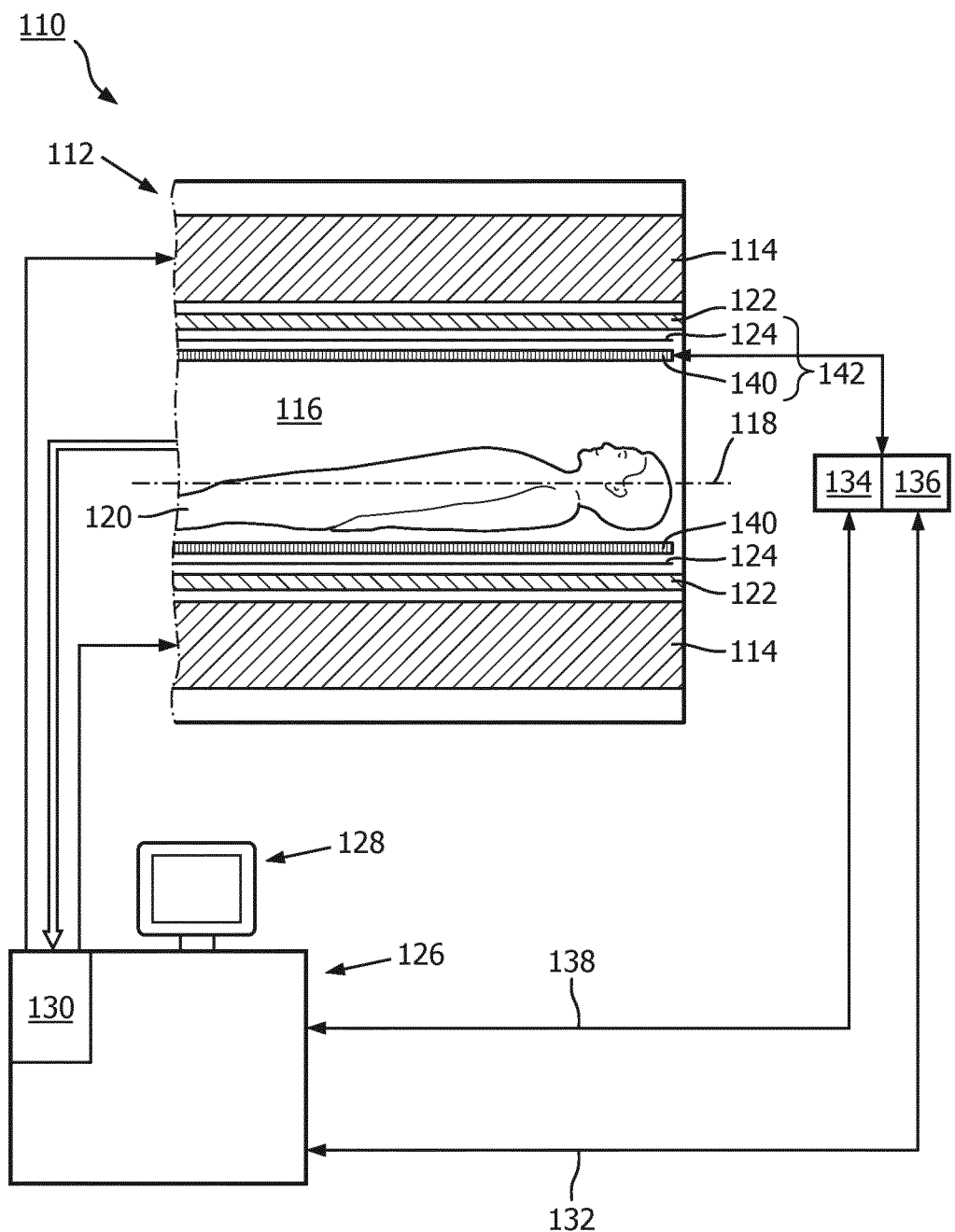
FIG. 1 is a schematic illustration of a part of a first, preferred embodiment of a magnetic resonance (MR) imaging system.

FIG. 1 shows a schematic illustration of a part of a magnetic resonance (MR) imaging system 110 comprising an MR scanner 112 according to a first, preferred embodiment. The MR imaging system 110 is described here generically as a basis for all discussed embodiments.

The MR imaging system 110 includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 have a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) coil device 140 designed as a whole-body coil having a tubular body. In an alternative embodiment, the RF coil 140 is designed as a head coil or any other suitable coil type for use in MR imaging systems 110. The RF coil device 140 is provided for applying a RF magnetic field to the examination space 116 during RF transmit phases to excite nuclei of the subject of interest 120, which shall be covered by MR images. The RF coil device 140 is also provided to receive MR signals from the excited nuclei during RF receive phases. In a state of operation of the MR imaging system 110, RF transmit phases and RF receive phases are taking place in a consecutive manner. The RF coil 140 is arranged concentrically within the bore of the main magnet 114. A cylindrical RF shield device 124 is arranged concentrically between the magnetic gradient coil system 122 and the RF coil device 140. Hence, the RF shield device 124 coaxially encompasses the RF coil 140. In some embodiments, the RF coil device 140 and the RF shield device 124 are provided integrally, thereby forming a radio frequency (RF) arrangement 142. Details regarding the implementation of the RF coil device 140 and the RF shield device 124 are discussed below.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 138 are installed between the MR imaging system control unit 126 and a RF transmitter unit 134 that is provided to feed RF power of an MR radio frequency to the RF coil device 140 via a RF switching unit 136 during the RF transmit phases. The RF switching unit 136 in turn is also controlled by the MR imaging system control unit 126, and another control line 132 is installed between the MR imaging system control unit 126 and the RF switching unit 136 to serve that purpose. During RF receive phase, the RF switching unit 136 directs the MR signals from the RF coil device 140 to the MR image reconstruction unit 130 after pre-amplification.

Figure 2A:
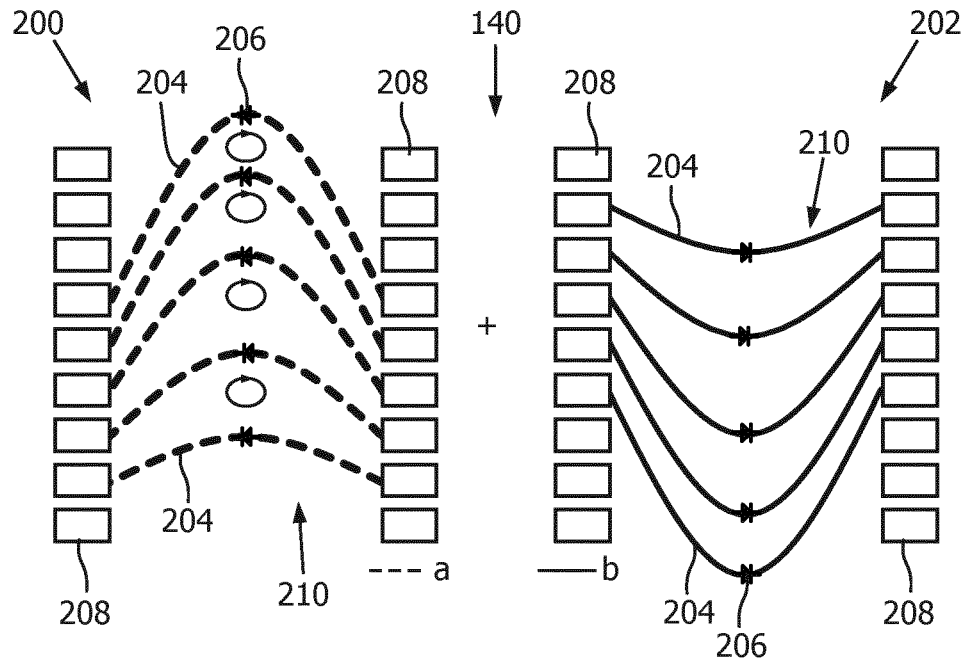
FIG. 2a is a schematic view of a RF coil device according to a second embodiment with a first coil and a second coil, which are independently shown.
Figures 2B, 3:
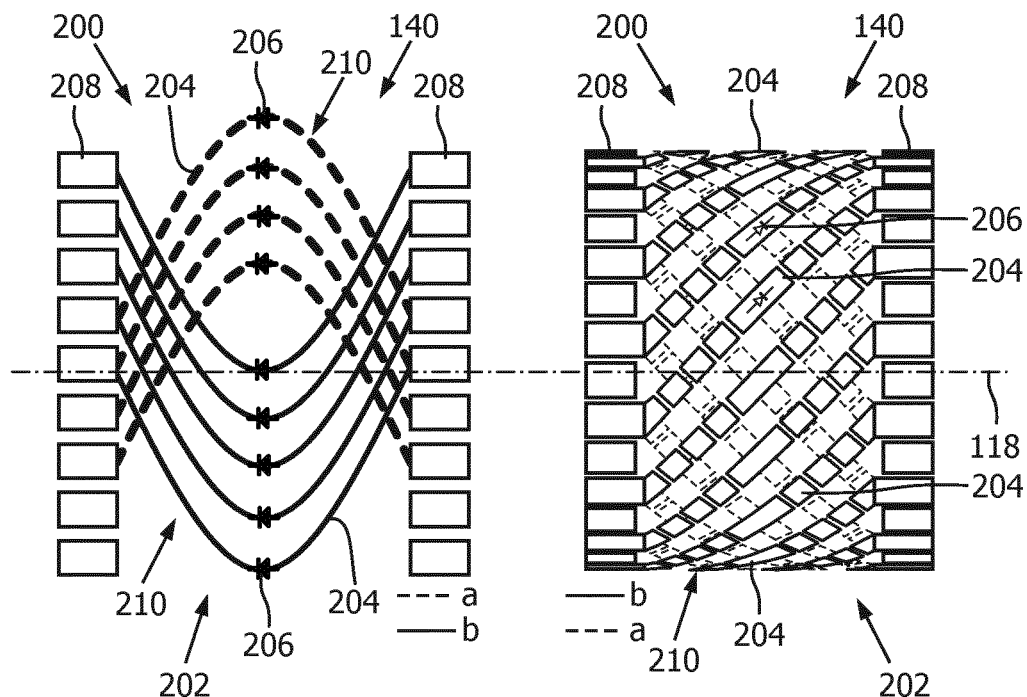
FIG. 2b is a schematic view of the RF coil device according to the second embodiment, whereby the first coil and the second coil are shown in an overlapping arrangement.
FIG. 3 is a view of the RF coil device according to a third embodiment with the first coil and the second coil, which are shown in an overlapping arrangement as a real RF coil device.
Figure 4A:
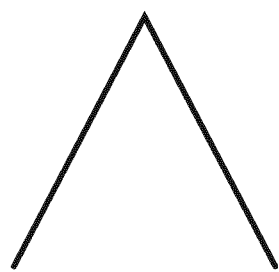
FIG. 4 is a schematic view of four different coil structures of a RF coil device according to a fourth embodiment.
Figure 4B:
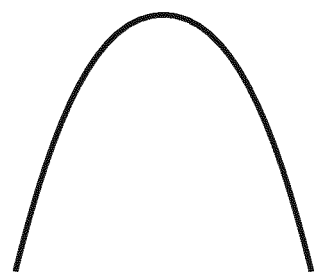
Figure 4C:
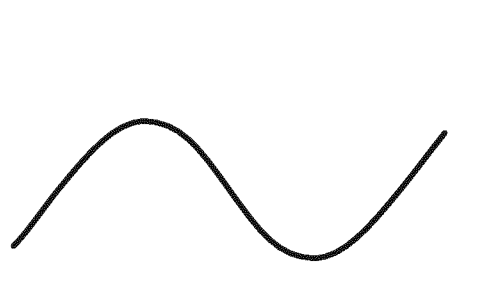
Figure 4D:
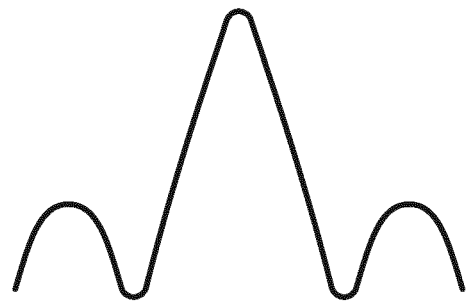

FIGS. 2a and 2b show a RF coil device 140 according to a second embodiment. As can be seen in FIG. 2, the RF coil device 140 of the second embodiment comprises a first coil 200 and a second coil 202, which are provided as birdcage coils in this embodiment. The first coil 200 and the second coil 202 are concentrically arranged around the center axis 118. The first coil 200 and the second coil 202 have rungs 204, which are provided in this embodiment with a diode 206 provided in a center region of the rungs 204. Hence, the diodes 206 are incorporated into the first and second coil 200, 202 to switch the respective coil 200, 202 either on or off.

The rungs 204 extend between end rings 208 and are arranged non-parallel to the center axis 118 of the RF coil device 140. The first coil 200 has a coil structure 210 different from a coil structure 210 of the second coil 202, as can be clearly seen in the overlapping view of FIG. 2b.

According to the second embodiment, the first and the second coil 200, 202 are arranged to share the conductive end rings 208. In an alternative embodiment, the first and the second coil 200, 202 are arranged to share only one of the end rings 208. However, in a further alternative embodiment, the first and the second coil 200, 202 each have their individual pair of the end rings 208.

As can be further seen in FIG. 2, the first coil 200 and the second coil 202 have a coil structure 210 with a parabolic shape of the rungs 204 extending between the end rings 208 of the respective first and second coil 200, 202. The resulting coil structure 210 of the first coil 200 is mirrored compared to a coil structure 210 of the second coil 202. Mirroring is performed in respect to a cylindrical surface at a center axis of the cylindrical surface in an axial direction, i.e. the center axis 118, of the RF coil device 140. With the RF coil device 140 of the present invention, each coil 200, 202 has an optimized coil structure 210 in respect to a TX mode and a RX mode of the RF coil device 140.

The first coil 200 and the second coil 202 are switchable to be active for the different modes of operation, e.g. the first coil 200 for TX mode, and the second coil 202 for RX mode, or vice versa. Hence, the coil 200, 202 out of the first coil 200 and the second coil 202 active for TX mode is provided with a coil structure 210 for high power transmission, and the coil 200, 202 active for RX mode is provided with a low power design.

FIG. 3 shows a RF coil device 140 according to a third embodiment. The structure of the RF coil device 140 of the third embodiment is essentially identical to that of the second embodiment, so that only differences between the RF coil devices 140 of the second and third embodiment will be discussed in detail. Features not explicitly described for the RF coil device 140 of the third embodiment are as described above in respect to the second embodiment.

As can be seen in FIG. 3, the RF coil device 140 of the third embodiment comprises a first coil 200 and a second coil 202, which are provided as birdcage coils, and which are concentrically arranged around the center axis 118. The first coil 200 and the second coil 202 have rungs 204, which are provided with a diode 206 provided in a center region thereof. The rungs 204 extend between end rings 208 and are arranged non-parallel to the center axis 118 of the RF coil device 140. In particular, the first coil 200 and the second coil 202 have a coil structure 210 with a spiral shape of the rungs 204 extending between the end rings 208 of the respective first and second coil 200, 202. Hence, the first coil 200 has a coil structure 210 different from a coil structure 210 of the second coil 202.

The first coil 200 and the second coil 202 are switchable to be active for the different modes of operation, e.g. the first coil 200 for TX mode, and the second coil 202 for RX mode, or vice versa. Hence, the coil 200, 202 out of the first coil 200 and the second coil 202 active for TX mode is provided with a coil structure 210 for high power transmission, and the coil 200, 202 active for RX mode is provided with a low power design.

FIG. 4 refers to a fourth embodiment of the RF coil device 140. The fourth embodiment is based on the RF coil device 140 of the second and/or third embodiment. Features not explicitly discussed with respect to the fourth embodiment are as described above with respect to the second and/or third embodiment.

As can be seen in FIG. 4, the first coil 200 and the second coil 202 can have a coil structure 210 having rungs 204 with different shapes. Hence, the first coil 200 and the second coil 202 have a coil structure 210 with V-shape, as can be seen in FIG. 4a, a parabolic shape, as can be seen in FIG. 4b, a sinusoidal shape, as can be seen in FIG. 4c, or sinc-shape, as can be seen in FIG. 4d.

In a preferred embodiment, the first coil 200 and the second coil 202 both have a parabolic shape, and the coil 200, 202 out of the first coil 200 and the second coil 202 active for TX mode is provided with an extension of 70 degrees, and the coil 200, 202 active for RX mode is provided with an extension of 150 degrees.

Figure 5:
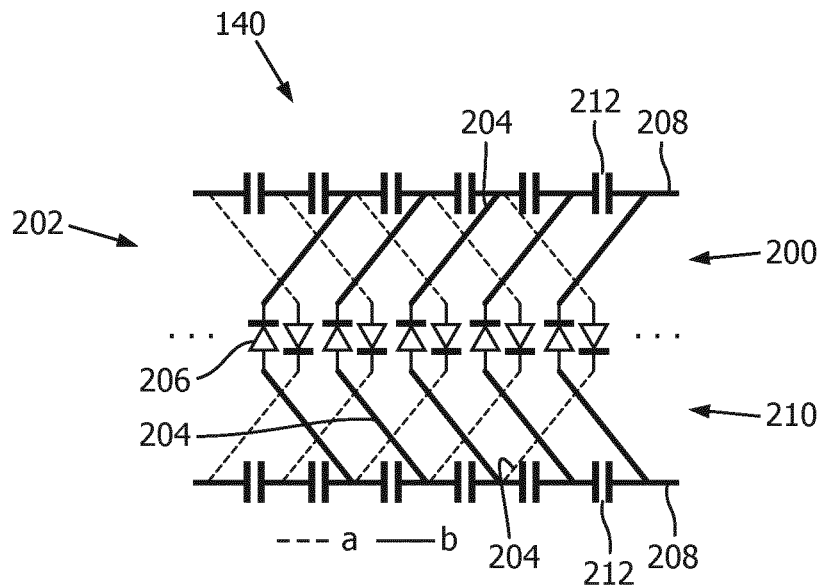
FIG. 5 is a detailed, schematic view of a RF coil device according to a fifth embodiment with the first coil and the second coil, which are shown in an overlapping arrangement.

FIG. 5 refers to a fifth embodiment of the RF coil device 140. The fifth embodiment is based on the RF coil devices 140 of the previous second to fourth embodiments. Features not explicitly discussed with respect to the fifth embodiment are as described above with respect to at least one of the second, third and/or fourth embodiment.

The RF coil device 140 of the fifth embodiment is essentially identical to the RF coil device 140 of the second embodiment. However, as can be seen in FIG. 5, the rungs 204 are provided having a V-shape. Furthermore, the embodiment of the RF coil device 140 of FIG. 5 is displayed with coupling capacitors 212, which are provided along the end rings 208. In particular, the coupling capacitors 212 divide the end rings 208 between connected rungs 204.

Figure 6:
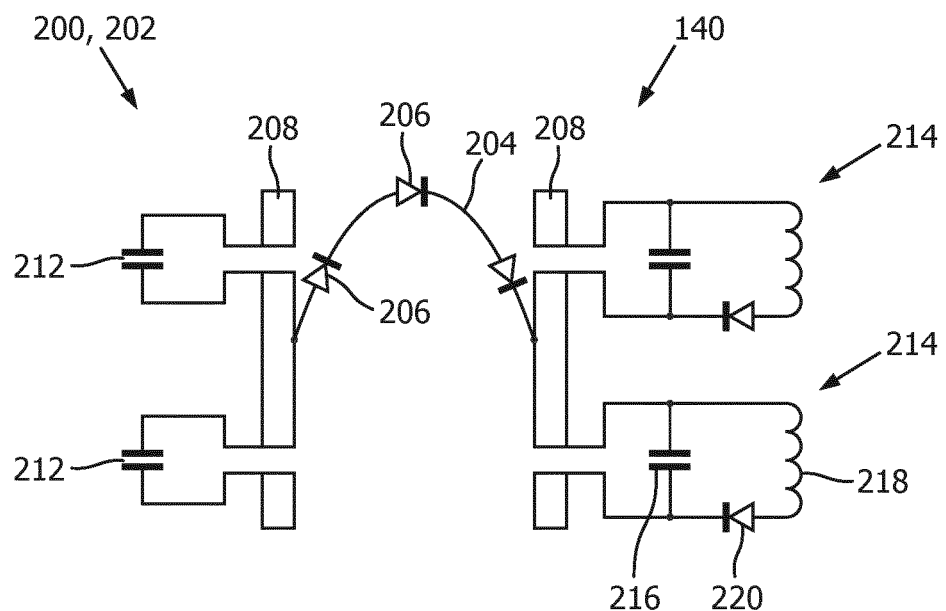
FIG. 6 is a detailed, schematic view of a first coil and a second coil of a RF coil device according to a sixth embodiment with tuning elements.

FIG. 6 refers to a sixth embodiment of the RF coil device 140. The sixth embodiment is based on the RF coil device 140 of the second to fifth embodiments. Features not explicitly discussed with respect to the sixth embodiment are as described above with respect to at least one of the second to fifth embodiment.

The RF coil device 140 of the sixth embodiment is essentially identical to the RF coil device 140 of the second embodiment. However, as can be seen in FIG. 6, the rungs 204 of both the first and second coil 200, 202 are provided with three diodes 206 along their length. Furthermore, also the embodiment of the RF coil device 140 of FIG. 6 is displayed with coupling capacitors 212 along one end ring, as already discussed above with respect to the fourth embodiment. Hence, the coupling capacitors 212 are provided along the end ring 208, dividing the end ring 208 between connected rungs 204. Furthermore, the other end ring 208 is provided with tuning devices 214. Although not visible in FIG. 6, the tuning devices 214 of the first and the second coil 200, 212 are located at different cylindrical positions in respect to the RF coil device 140.

The tuning devices 214 are provided to tune the first coil 200 and the second coil 202. The tuning devices 214 in this embodiment comprise a tuning capacitor 216 and a tuning coil 218, which form a resonant circuit. Furthermore, a tuning diode 220 is provided in the resonant circuit to change the tuning of the respective resonator. The coil 200, 202 out of the first coil 200 and the second coil 202 active for TX mode is provided as a multi frequency tuned coil 200, 202, and the coil 200, 202 out of the first coil 200 and the second coil 202 active for RX mode is provided as a single frequency tuned coil 200, 202. Hence, in this embodiment, the coil 200, 202 active for TX mode is a double tuned coil 200, 202, which is tuned at fluorine F19 and H1 proton, and the coil 200, 202 active for RX mode is a single tuned coil 200, 202, which is tuned for H1 proton only.

Figure 7A:
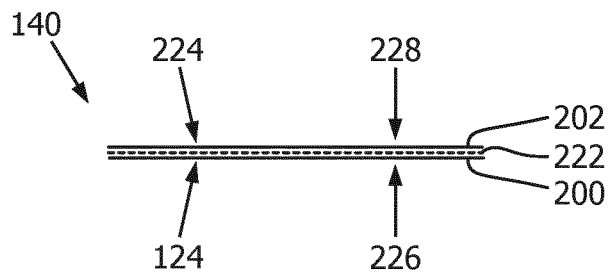
FIG. 7a is a detailed, schematic view of a RF coil device according to a seventh embodiment with the first coil and the second coil arranged as metallizations on an inner side and an outer side of a coil PCB, respectively.

FIG. 7a refers to a seventh embodiment of the RF coil device 140. The seventh embodiment is based on the RF coil devices 140 of the second to sixth embodiments. Features not explicitly discussed with respect to the seventh embodiment are as described above with respect to at least one of the second to sixth embodiment.

In addition to the RF coil devices 140 of the previous embodiments, the RF coil device 140 of the seventh embodiment is provided with a cylindrical coil PCB 222. The coil PCB 222 comprises a dielectric material, which is known as FR-4 in this embodiment.

The first coil 200 and the second coil 202 are provided as metallization layers 224 at an inner side 226 and an outer side 228 of the coil PCB 222, respectively. The metallization layer 224 refers to a metallic coil structure 210 deposited on the coil PCB 222, which can have essentially any suitable structure.

In the seventh embodiment, the first coil 200 is active in TX mode, and the second coil 202 is active in RX mode. Therefore, the first coil 200 is provided with a higher thickness compared to a relatively small thickness of the second coil 202. The metallization layers 224 of the first coil 200 and the second coil 202 are formed comprising coil elements 230, which are indicated e.g. in FIG. 7b. The thickness refers to a thickness of the metallization layers 224 as deposited on the coil PCB 222

Figure 7B:
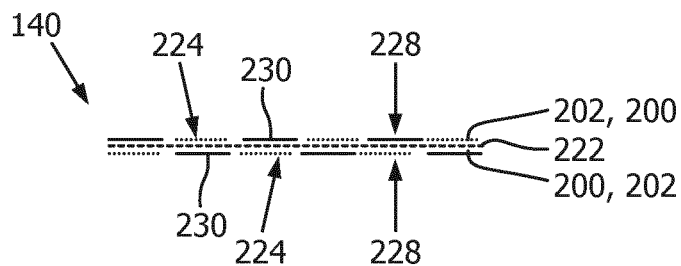
FIG. 7b is a detailed, schematic view of a RF coil device according to an eighth embodiment with the first coil and the second coil arranged as metallizations along both the inner side and the outer side of the coil PCB.

FIG. 7b refers to an eighth embodiment of the RF coil device 140. The eighth embodiment is based on the RF coil devices 140 of the second to seventh embodiments. Features not explicitly discussed with respect to the eighth embodiment are as described above with respect to at least one of the second to seventh embodiment.

Also the RF coil device 140 of the eighth embodiment is provided with a cylindrical coil PCB 222 formed of FR-4. The RF coil device 140 comprises metallization layers 224 at an inner side 226 and an outer side 228 of the coil PCB 222. The metallization layer 224 is deposited on the coil PCB 222. The metallization layers 224 at the inner side 226 and the outer side 228 of the coil PCB 222 are formed comprising individual coil elements 230, as indicated in FIG. 7b.

According to the eighth embodiment, each of the first coil 200 and the second coil 202 is formed comprising coil elements 230 of the metallization layers 224 on both the inner side 226 and the outer side 228 of the coil PCB 222. The respective coil elements 230 at the inner side 226 and the outer side 228 of the coil PCB 222 are coupled to each other to form the coil structures 210 of the first coil 200 and the second coil 202.

Figure 8:
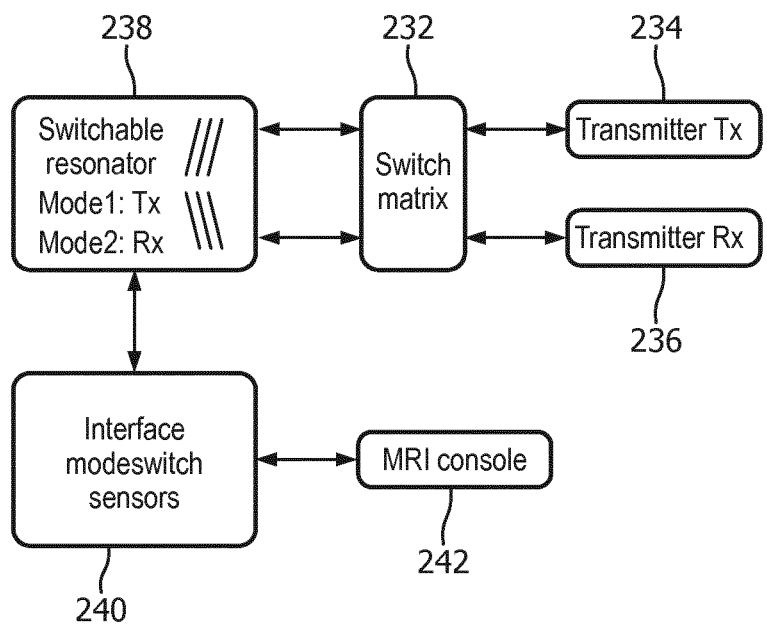
FIG. 8 is a schematic view of signal paths in a switching configuration for a RF coil device according to a ninth embodiment.

FIG. 8 indicates signal paths in a switching configuration for a RF coil device 140 according to a ninth embodiment. Accordingly, a switch matrix 232 is connected to a transmit path 234 and a receive path 236. The switch matrix 232 is also referred to as switching device. The transmit path 234 is connected to the coil 200, 202, which is active in TX mode, and the receive path 236 is connected to the coil 200, 202, which is active in RX mode. Furthermore, a switchable resonator 238 is connected to the switch matrix 232. The coil structures 210 of the first and second coil 200, 202 are mirrored in operation with the switch matrix 232, which is an electronic switch. Hence, both coils 200, 202 can be used sequentially or optimally selected relative to the orientation to the subject of interest 120. The orientations are used independently for transmit TX and receive RX to tune the coil structure 210 for optimal B+ and B− homogenization. Signal flow between the switchable resonator 238 and a MRI console 242 is realized via an interface 240 for mode-switch sensors to perform mode switching and establish correct signal flow. The MRI console 242 in this embodiment is integral part of the monitor unit 128.

Figure 9:
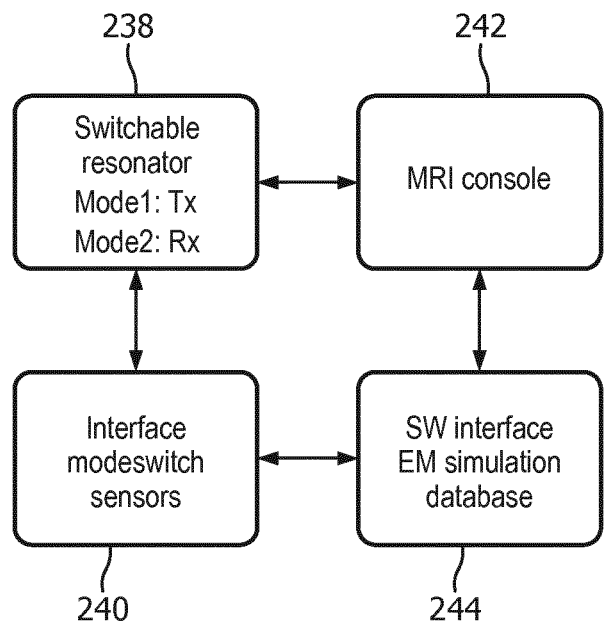
FIG. 9 is a schematic view of a communication of a switching configuration for a RF coil device according to a tenth embodiment.

A respective communication is indicated in FIG. 9 with respect to a tenth embodiment. Hence, a communication between the switchable resonator 238, the MRI console 242, and the interface 240 includes communication with a simulation database 244. Pre EM simulation results or real time estimation and mapping to simulation database 244 is calculated and a corresponding mode for a MR sequence is selected.

Figure 10:
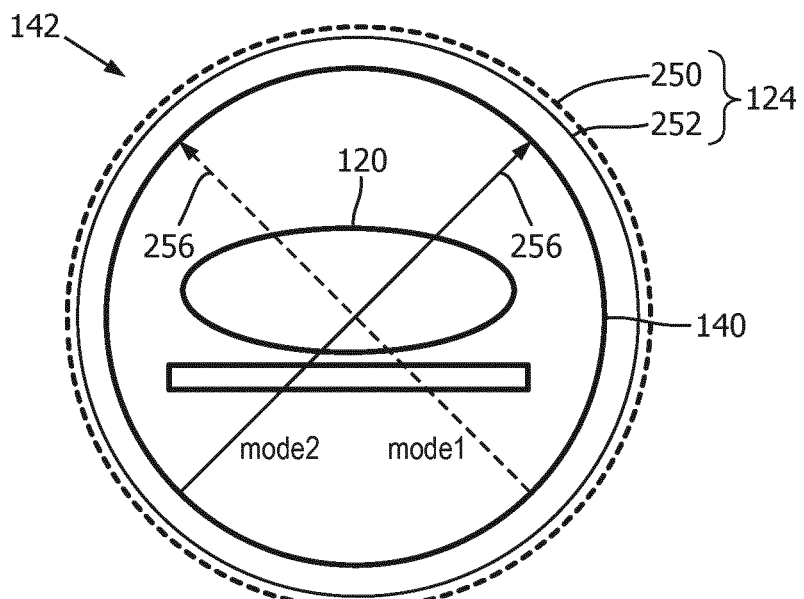
FIG. 10 is a schematic view of an RF arrangement comprising a RF coil device and a RF shield device according to an eleventh embodiment.

FIG. 10 shows a RF arrangement 142 of an eleventh embodiment comprising a RF coil device 140 in accordance with any of the previous embodiments and a RF shield device 124. The RF coil device 140 is a RF coil device 140 according to one of the previous embodiments. Hence, technical details of the RF coil device 140 of the eleventh embodiment will not be repeatedly discussed.

The RF shield device 124 according to the eleventh embodiment comprises a first shield 250 and a second shield 252. The first shield 250 and the second shield 252 are concentrically arranged around the center axis 118. The first shield 250 and the second shield 252 have different shield structures 254 and are designed in accordance with the two different modes of operation of a RF coil device 140. Hence, the two shield structures 254 can be combined in a single RF shield device 124. Hence, when the MR imaging system 110 switches between the different modes of operation, the RF shield device 124 adequately shields the resulting RF fields with the two individual shields 250, 252, each of which is optimized for one mode of operation of the RF coil device 140. Additionally, as indicated in FIG. 10, each of the first and second coil 200, 202 can have different resonance modes, which are indicated by arrows 256 in FIG. 10. Typically, a RF coil device 140 with a birdcage structure has two independent, usable resonance modes 256, one with a sine- and one with a cosine-like current distribution, as indicated by the 90° phase difference between the arrows 256. These different resonance modes 256 increase the degrees of freedom in using the RF coil device 140.

Figure 11A:
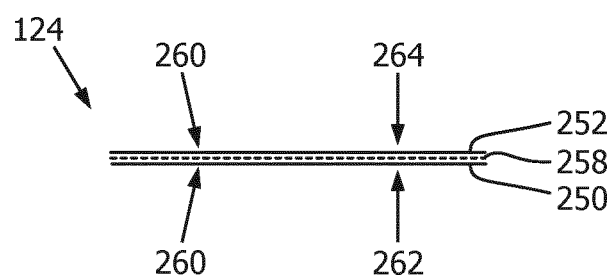
FIG. 11a is a detailed, schematic view of a RF shield device according to a twelfth embodiment with the first shield and the second shield arranged as metallizations on an inner side and an outer side of a shield PCB, respectively.

FIG. 11a refers to a twelfth embodiment of the RF shield device 124. The eleventh embodiment is based on the RF shield device 124 of the eleventh embodiment. Features not explicitly discussed with respect to the twelfth embodiment are as described above with respect to the eleventh embodiment.

In addition to the RF shield device 124 of the previous embodiment, the RF shield device 124 of the twelfth embodiment is provided with a cylindrical shield PCB 258. The shield PCB 258 comprises a dielectric material, which is known as FR-4 in this embodiment.

The first shield 250 and the second shield 252 are provided as metallization layers 260 at an inner side 262 and an outer side 264 of the shield PCB 258, respectively. The metallization layer 260 refers to a metallic shield structure 254, which is deposited on the shield PCB 258, and which can have essentially any desired structure.

Figure 11B:
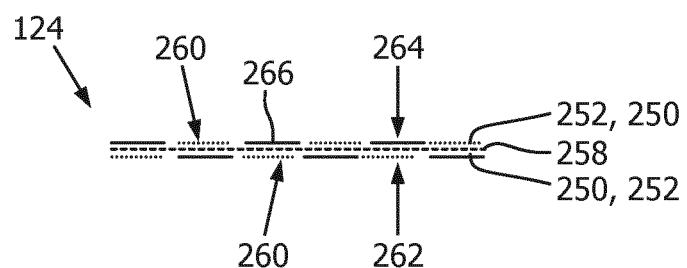
FIG. 11b is a detailed, schematic view of a RF shield device according to a thirteens embodiment with the first shield and the second shield arranged as metallizations along both the inner side and the outer side of the shield PCB.

FIG. 11b refers to a thirteenth embodiment of the RF shield device 124. The thirteenth embodiment is based on the RF shield devices 124 of the eleventh to twelfth embodiments. Features not explicitly discussed with respect to the thirteenth embodiment are as described above with respect to at least one of the tenth to twelfth embodiment.

Also the RF shield device 124 of the thirteenth embodiment is provided with a cylindrical shield PCB 258 formed of FR-4. The RF shield device 124 comprises metallization layers 260 at an inner side 262 and an outer side 264 of the shield PCB 258. The metallization layer 260 refers to a metallic shield structure 254 deposited on the shield PCB 258. The metallization layers 260 at the inner side 262 and the outer side 264 of the shield PCB 258 are formed comprising shield elements 230, as indicated in FIG. 11b.

According to the thirteenth embodiment, the first shield 250 and the second shield 252 are formed comprising shield elements 266 of the metallization layers 260 on both the inner side 262 and the outer side 264 of the shield PCB 222. The respective shield elements 266 at the inner side 262 and the outer side 264 of the shield PCB 258 are coupled to each other to form the shield structures 254 of the first shield 250 and the second shield 252.

Figure 12:
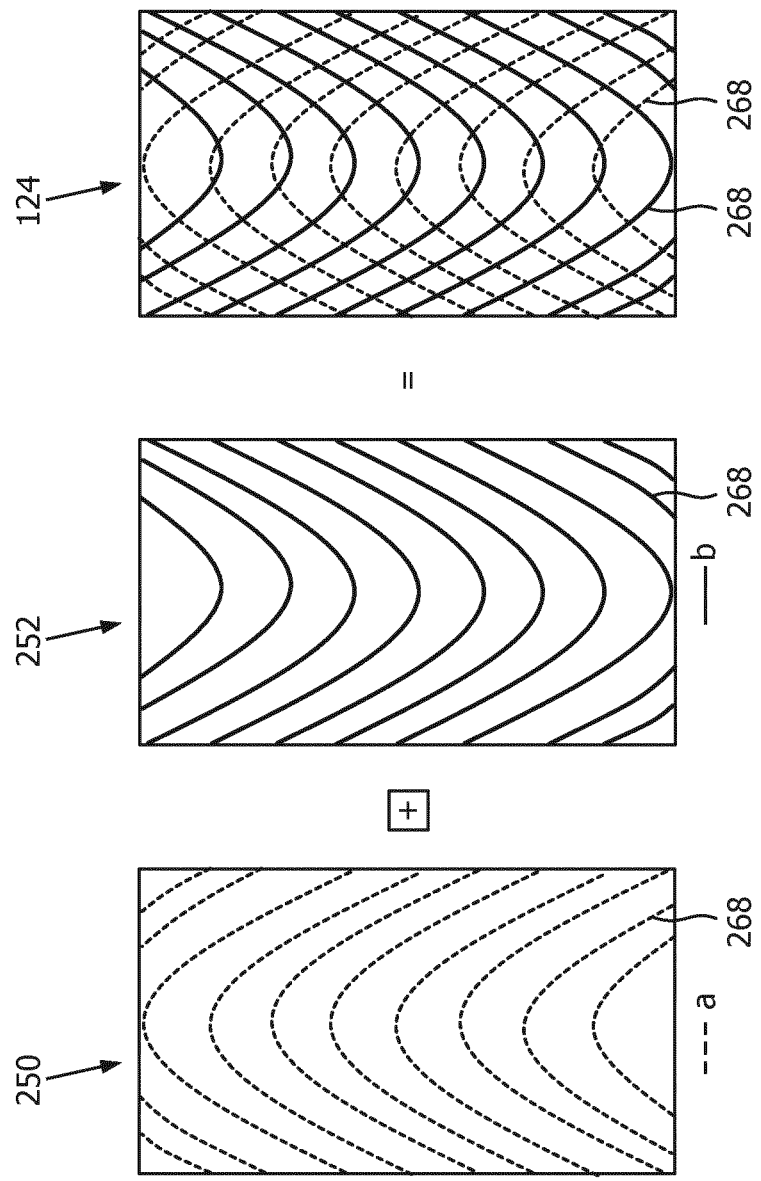
FIG. 12 is a schematic view of a RF shield device according to a fourteenth embodiment with a first coil and a second coil, which are shown independently and in combination.

FIG. 12 refers to a fourteenth embodiment of the RF shield device 124. The fourteenth embodiment is based on the RF shield device 124 of the eleventh or twelfth embodiment. Features not explicitly discussed with respect to the fourteenth embodiment are as described above with respect to the eleventh or twelfth embodiment.

In accordance with the twelfth embodiment, the RF shield device 124 of the fourteenth embodiment is provided with a cylindrical shield PCB 258. A first shield 250 and a second shield 252 are provided as metallization layers 260 at an inner side 262 and an outer side 264 of the shield PCB 258, respectively. The metallization layer 260 refers to a metallic shield structure 254, which is deposited on the shield PCB 258. The first shield 250 and the second shield 252 are formed corresponding to the first and second coil 200, 202 of the RF coil device 140. Accordingly, the first shield 250 and the second shield 252 have a shield structure with parabolic slits 268. In an alternative embodiment, the first shield 250 and the second shield 252 have a shield structure with sinusoidal slits, V-slits, a sinc-shape slits, or any combination thereof.

With the RF shield device 124 of the discussed embodiments, each shield 250, 252 can be provided with an optimized coil 210 structure in respect to a TX mode and a RX mode of the RF coil device 140.

Figure 13:
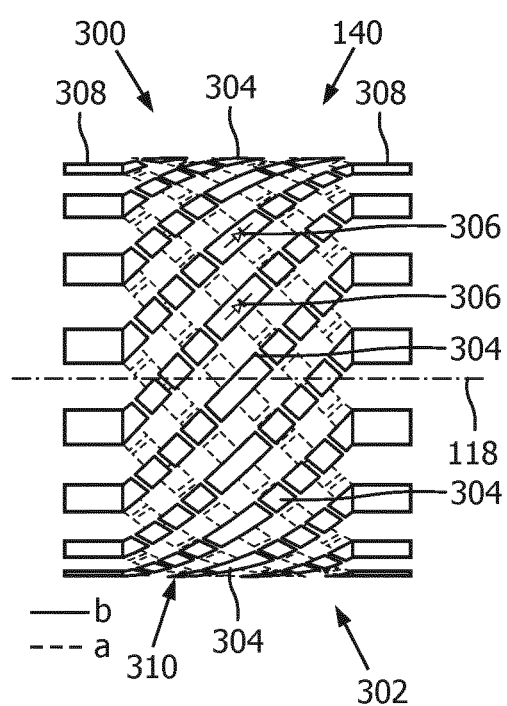
FIG. 13 is a view of the RF coil device according to a fifteenth embodiment with the first coil and the second coil, which are shown in an overlapping arrangement as a real RF coil device, in a configuration as TEM-coils.

FIG. 13 shows a RF coil device 140 according to a fifteenth embodiment. The RF coil device 140 of the fifteenth embodiment is provided as a TEM-coil, as will be discussed below in more detail. However, also for the RF coil device 140 of the fifteenth embodiment, the general principles discussed above with respect to the embodiments referring to RF coil devices 140 with a birdcage structure also apply.

As can be seen in FIG. 13, the RF coil device 140 of the fifteenth embodiment comprises a first coil 300 and a second coil 302, which are concentrically arranged around the center axis 118. The first coil 300 and the second coil 302 have rungs 304, which are arranged non-parallel to the center axis 118 of the RF coil device 140. The rungs 304 are provided in this embodiment with a diode 306 provided in a center region thereof.

The rungs 304 extend between longitudinal ends of the RF coil device 140 and are arranged non-parallel to the center axis 118 of the RF coil device 140. The first coil 300 has a coil structure 310 different from a coil structure 310 of the second coil 302, as can be clearly seen in FIG. 13. In particular, the first coil 300 and the second coil 302 have a coil structure 310 with a spiral shape of the rungs 304. With the RF coil device 140 of the fifteenth embodiment, each coil 300, 302 has an optimized coil structure 310 in respect to a TX mode and a RX mode of the RF coil device 140.

According to the fifteenth embodiment, the RF coil device 140 is provided integrally with a RF screen device 124 surrounding the first coil 300 and the second coil 302. The RF screen device 124 is not explicitly shown in FIG. 13. The RF screen device 124 of the fifteenth embodiment is provided in accordance with the RF screen device 124 of the eleventh to fourteenth embodiment, i.e. the RF screen device 124 comprises two RF shields 250, 252 optimized for different modes of operation of the RF coil device 140. In an alternative embodiment, the RF shield device 124 comprises merely a single RF shield, as known in the Art.

The first and the second coil 300, 302 are provided at their end regions with coupling devices 308, which couple the rungs 304 at their end regions to the RF screen device 124. In particular, the rungs 304 of the first and the second coil 300, 302 are coupled to the first and second shield 250, 252, respectively. The coupling devices 308 comprise coupling capacitors.

The first coil 300 and the second coil 302 are switchable to be active for different modes of operation, e.g. the first coil 300 for TX mode, and the second coil 302 for RX mode, or vice versa. Hence, the coil 300, 302 out of the first coil 300 and the second coil 302 active for TX mode is provided with a coil structure 310 for high power transmission, and the coil 300, 302 active for RX mode is provided with a low power design.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space
118 center axis
120 subject of interest
122 magnetic gradient coil system
124 RF shield device
126 MR imaging system control unit
128 monitor unit
130 MR image reconstruction unit
132 control line
134 RF transmitter unit
136 RF switching unit
138 control line
140 radio frequency (RF) coil device
142 radio frequency (RF) arrangement
200 first coil
202 second coil
204 rung
206 diode
208 end ring
210 coil structure
212 coupling capacitor
214 tuning device
216 tuning capacitor
218 tuning coil
220 tuning diode
222 coil PCB
224 metallization layer (coil PCB)
226 inner side (coil PCB)
228 outer side (coil PCB)
230 coil element
232 switch matrix, switching device
234 transmit path
236 receive path
238 switchable resonator
240 interface
242 MRI console
244 simulation database
250 first shield
252 second shield
254 shield structure
256 resonance mode, arrow
258 shield PCB
260 metallization layer (shield PCB)
262 inner side (shield PCB)
264 outer side (shield PCB)
266 shield element
268 slit
300 first coil
302 second coil
304 rung
306 diode
308 coupling device
310 coil structure

The invention claimed is:

1. A radio frequency (RF) coil device for a magnetic resonance (MR) examination system, wherein the RF coil device comprises:
a first coil; and
a second coil, wherein:
the first coil and the second coil are provided as birdcage coils,
the first coil and the second coil are arranged with a common center axis,
the first coil and the second coil have rungs, which are arranged non-parallel to the center axis of the RF coil device,
the first coil has a coil structure which is mirrored compared to a coil structure of the second coil, and
the first coil and the second coil are switchable to be active for different modes of operation;
wherein one coil out of the first coil and the second coil is active for TX mode and is provided with a coil structure for high power transmission, and the other coil is active for RX mode and is provided with a low power design.

2. The RF coil device according to claim 1, wherein the first and the second coil are arranged to share at least one conductive end ring.

3. A radio frequency (RF) coil device for a magnetic resonance (MR) examination system, wherein the RF coil device comprises a first coil and a second coil,
the first coil and the second coil are arranged with a common center axis,
the first coil and the second coil have rungs, which are arranged non-parallel to the center axis of the RF coil device,
the RF coil device is provided integrally with a RF screen device surrounding the first coil and the second coil,
the rungs are coupled to the RF screen device,
the first coil has a coil structure which is mirrored compared to a coil structure of the second coil, and
the first coil and the second coil are switchable to be active for different modes of operation;
wherein one coil out of the first coil and the second coil is active for TX mode and is provided with a coil structure for high power transmission, and the other coil is active for RX mode and is provided with a low power design.

4. The RF coil device according to claim 1, wherein
the RF coil device comprises a cylindrical coil PCB, and
the rungs of the first coil and the second coil are provided as metallization layers at an inner side and an outer side of the coil PCB.

5. The RF coil device according to claim 4, wherein
the first coil and the second coil comprise coil elements of the metallization layers on both the inner side and the outer side of the coil PCB.

6. The RF coil device according to claim 1, wherein
the first coil and the second coil have a coil structure with sinusoidal shape, a parabolic shape, a V-shape, a spiral shape, or a sinc-shape of rungs, or any combination thereof.

7. The RF coil device according to claim 1, wherein
the different modes of operation comprise a TX mode and a RX mode of the RF coil device.

8. The RF coil device according to claim 1, wherein
the first and the second coil comprise each at least one tuning device, whereby
the tuning devices of the first and the second coil are located at different cylindrical positions in respect to the RF coil device.

9. A radio frequency (RF) coil device for a magnetic resonance (MR) examination system, the RF coil device comprising:
a first coil;
a second coil having a coil structure different from a coil structure of the first coil; and
a RF screen device surrounding the first coil and the second coil;
wherein:
the first coil and the second coil are arranged with a common center axis;
the first coil and the second coil have rungs which are arranged non-parallel to the common center axis, and the rungs are coupled to the RF screen device;
the first coil and the second coil are switchable to be active for different modes of operation;
the RF screen device includes a first shield and a second shield arranged with the common center axis;
the first shield has a shield structure different from a shield structure of the second shield and the first shield and the second shield are designed in accordance with the different modes of operation of the RF coil device; and
the rungs of the first and the second coil are coupled to the first and second shield, respectively.

10. A RF arrangement comprising a RF coil device according to claim 5 and a RF shield device the RF shield device includes a first shield and a second shield,
the first shield and the second shield are arranged with a common center axis,
the first shield has a shield structure different from a shield structure of the second shield,
and the first shield and the second shield are designed in accordance with the different modes of operation of a RF coil device.

11. A MR imaging system, comprising
a tubular examination space provided to position a subject of interest therein,
a RF shield device for shielding the examination space,
a magnetic gradient coil system for generating gradient magnetic fields superimposed to the static magnetic field, and
a main magnet for generating a static magnetic field,
whereby the RF shield device, the magnetic gradient coil system and the main magnet are positioned concentrically in this order in a direction radially outward around the examination space, wherein
the MR imaging system comprises at least one RF coil device according to claim 5, which is arranged concentrically within the RF shield device, and
the MR imaging system further comprises a switching device for switching the RF coil device between at least two different modes of operation.

12. The MR imaging system according to claim 11, further including
a RF shield device.

13. A MR imaging system, comprising
a tubular examination space provided to position a subject of interest therein,
a magnetic gradient coil system for generating gradient magnetic fields superimposed to the static magnetic field, and
a main magnet for generating a static magnetic field,
whereby the magnetic gradient coil system and the main magnet are positioned concentrically in this order in a direction radially outward around the examination space, wherein
the MR imaging system comprises at least one RF coil device according to claim 1, which is arranged concentrically within magnetic gradient coil system, and
the MR imaging system further comprises a switching device for switching the RF coil device between at least two different modes of operation.

* * * * *